United States Patent
Ryu et al.

(10) Patent No.: US 9,318,195 B1
(45) Date of Patent: Apr. 19, 2016

(54) MULTI-LEVEL MEMORY APPARATUS AND DATA SENSING METHOD THEREOF

(71) Applicants: SK hynix Inc., Icheon (KR); Korea Advanced Institute of Science and Technology, Daejeon (KR)

(72) Inventors: Seung Tak Ryu, Daejeon (KR); Ji Wook Kwon, Daejeon (KR); Dong Hwan Jin, Seoul (KR)

(73) Assignees: SK HYNIX INC., Icheon (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 14/746,200

(22) Filed: Jun. 22, 2015

(30) Foreign Application Priority Data

Oct. 24, 2014 (KR) .......................... 10-2014-0144746

(51) Int. Cl.
*G11C 11/34* (2006.01)
*G11C 13/00* (2006.01)

(52) U.S. Cl.
CPC .......... *G11C 13/004* (2013.01); *G11C 13/0004* (2013.01)

(58) Field of Classification Search
USPC ........................................ 365/185.03, 189.07
See application file for complete search history.

(56) References Cited

U.S. PATENT DOCUMENTS

| | | | |
|---|---|---|---|
| 8,717,802 B2 | 5/2014 | Lam et al. | |
| 2007/0025146 A1 | 2/2007 | Huang | |
| 2012/0063195 A1* | 3/2012 | Lam ................... | G11C 11/5642 365/148 |
| 2013/0093495 A1* | 4/2013 | Fukuda .................... | G06G 7/14 327/361 |
| 2014/0010023 A1* | 1/2014 | Park ..................... | G11C 13/004 365/189.02 |

FOREIGN PATENT DOCUMENTS

KR 10-2014-0006544 A 1/2014

* cited by examiner

*Primary Examiner* — Anthan Tran

(57) ABSTRACT

A multi-level memory device may include a most significant bit (MSB) determination circuit configured to determine a plurality of MSBs by comparing a cell current flowing through a memory cell with a predetermined reference current, a current/voltage conversion circuit configured to convert a copied cell current obtained by copying the cell current into a cell voltage, a charging time determination circuit configured to determine a charging time during which the copied cell current is converted into the cell voltage and output a charging end signal, and a least significant bit (LSB) determination circuit configured to determine a plurality of LSBs according to the cell voltage and the charging end signal.

17 Claims, 8 Drawing Sheets

Prior Art

MULTI-LEVEL MEMORY APPARATUS AND DATA SENSING METHOD THEREOF

CROSS-REFERENCE TO RELATED APPLICATION

The present application claims priority of Korean Patent Application No. 10-2014-0144746, filed on Oct. 24, 2014, which is incorporated herein by reference in its entirety.

BACKGROUND

1. Field

Embodiments of the present disclosure relate to a semiconductor device, and more particularly, to a memory device including multi-level memory cells.

2. Description of the Related Art

A conventional DRAM includes a memory cell having a capacitor, and stores data while charging or discharging the memory cell. However, the DRAM is a volatile memory due to a leakage current of the capacitor. In order to address the above issue of the DRAM, nonvolatile memories have been developed. In particular, a phase change memory device including phase change memory cells have been developed.

FIG. 1 schematically illustrates the configuration of a conventional phase change memory device shown in FIG. 4 of US Patent Laid-open Publication No. 2012/0063195. The conventional memory device illustrated in FIG. 1 includes a memory cell 102 and a sense amplifier 410. The memory cell 102 is formed of a resistive material of which the resistance value may be changed according to a temperature or current, and has a different resistance value according to data stored therein.

The sense amplifier 410 compares a cell voltage VCELL, which is applied to a bit line according to a current flowing through the memory cell 102, to a reference voltage VREF(t) that increases with time, and detects the data stored in the memory cell 102.

According to such a structure, however, since the current must be continuously supplied to the memory cell 102 until the sense amplifier 410 detects the data stored in the memory cell 102, power consumption increases. Furthermore, since the current is continuously supplied to the memory cell 102 until the data stored in the memory cell 102 is confirmed, which may prevent some other operations from being simultaneously performed, such a structure has a limitation in improving a data processing speed.

SUMMARY

Various embodiments are directed to a multi-level memory device in which a cell current does not continuously flow into a memory cell while data stored in the memory cell is detected, and a data sensing method thereof.

Also, various embodiments are directed to a multi-level memory device capable of performing a most significant bit (MSB) determination operation for data stored in a memory cell, while performing a least significant bit (LSB) determination operation for data stored in another memory cell.

In an embodiment, a multi-level memory device may comprise: a most significant bit (MSB) determination circuit configured to determine a plurality of MSBs by comparing a cell current flowing through a memory cell with a predetermined reference current; a current/voltage conversion circuit configured to convert a copied cell current obtained by copying the cell current into a cell voltage; a charging time determination circuit configured to determine a charging time during which the copied cell current is converted into the cell voltage and output a charging end signal; and a least significant bit (LSB) determination circuit configured to determine a plurality of LSBs according to the cell voltage and the charging end signal.

The current/voltage conversion circuit may comprise: a cell voltage charging circuit comprising a plurality of capacitors coupled in parallel, the plurality of capacitors including a capacitor that has a terminal, the capacitor being charged to have the cell voltage at the terminal; a path selection circuit configured to provide a path through which the copied cell current flows into the charged capacitor, in response to an output of the MSB determination circuit; and a comparison switching circuit configured to couple the charged capacitor to the LSB determination circuit and output the cell voltage according to the charging end signal.

The plurality of capacitors may have different capacities.

The plurality of capacitors may have the same capacity.

The charging time determination unit may comprise: a section maximum cell current driving circuit configured to generate a section maximum cell current; a section maximum copied cell current driving circuit configured to generate a section maximum copied cell current that is substantially the same as the section maximum cell current; a section maximum cell voltage charging circuit including a terminal, the section maximum cell voltage charging circuit configured to receive the section maximum copied cell current and be charged to have a maximum charging voltage at the terminal; and a charging end signal generation circuit configured to output the charging end signal, when a level of the maximum charging voltage becomes substantially equal to that of a first reference voltage output from the LSB determination circuit.

The LSB bit determination unit may comprise: a reference voltage generation circuit configured to generate first and second reference voltages; a bit counter configured to output an LSB count signal according to the second reference voltage; a comparison circuit configured to compare the second reference voltage and the cell voltage and output a result of the comparison; and an LSB bit storage configured to store the LSB count signal and output the stored LSB count signal in response to the result of the comparison.

In an embodiment, a multi-level memory device may comprise: a plurality of analog/digital (A/D) converters; a charging time determination circuit configured to determine a time during which a copied cell current is converted into a cell voltage and output a charging end signal, the copied cell current being substantially the same as a cell current flowing through a memory cell; and a least significant bit (LSB) determination circuit configured to determine a plurality of LSBs of data stored in the memory cell according to the charging end signal, wherein the A/D converters share the charging time determination circuit and the LSB determination circuit.

Each of the A/D converters may comprise: a most significant bit (MSB) determination circuit configured to determine a plurality of MSBs by comparing the cell current to a predetermined reference current; and a current/voltage conversion circuit configured to convert the copied cell current into the cell voltage.

In an embodiment, a data sensing method of a multi-level memory device may comprise: determining a plurality of most significant bits (MSBs) by comparing a cell current flowing through a memory cell to a predetermined reference current; converting a copied cell current obtained by coping the cell current into a cell voltage, and storing the cell voltage during a charging time; determining the charging time during which the copied cell current is converted into the cell voltage and outputting a charging end signal; and determining a plurality of least significant bits (LSBs) according to the cell voltage and the charging end signal.

The determining of the plurality of LSBs may comprise: sequentially coupling a plurality of capacitors to a power supply voltage; generating a reference voltage that increases in a stepwise manner as a number of the sequentially coupled capacitors increases; and outputting an LSB count signal when a level of the reference voltage becomes equal to or greater than that of the cell voltage.

DETAILED DESCRIPTION

Figure 1:
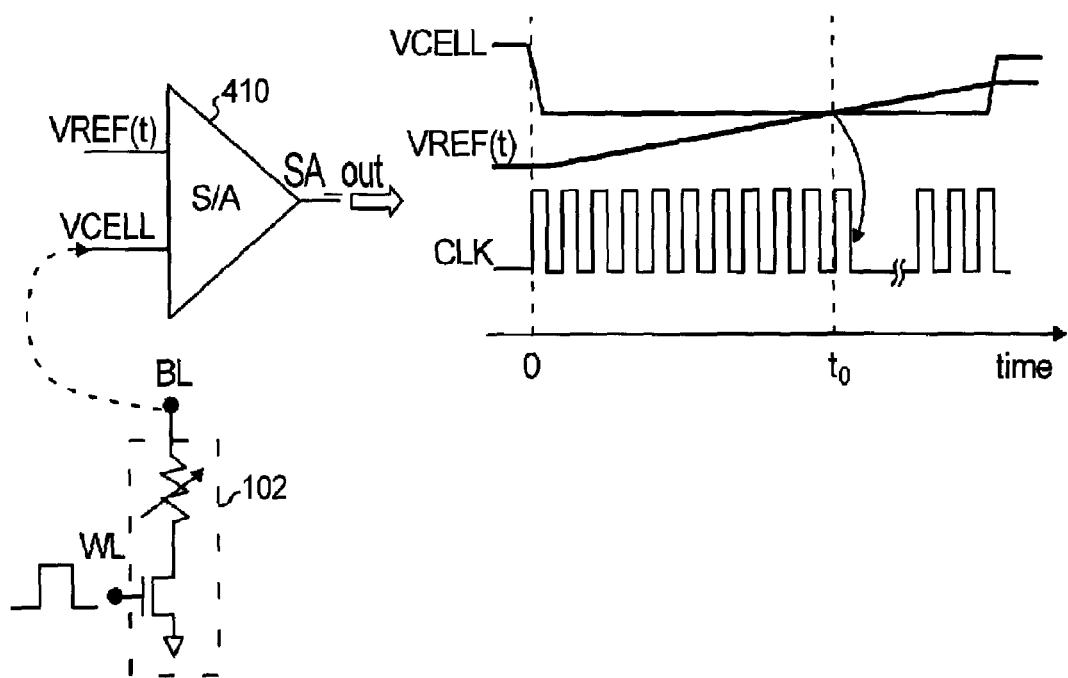
FIG. 1 schematically illustrates the configuration of a conventional phase change memory device.

Various embodiments will be described below in more detail with reference to the accompanying drawings. Embodiments may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

Figure 2:
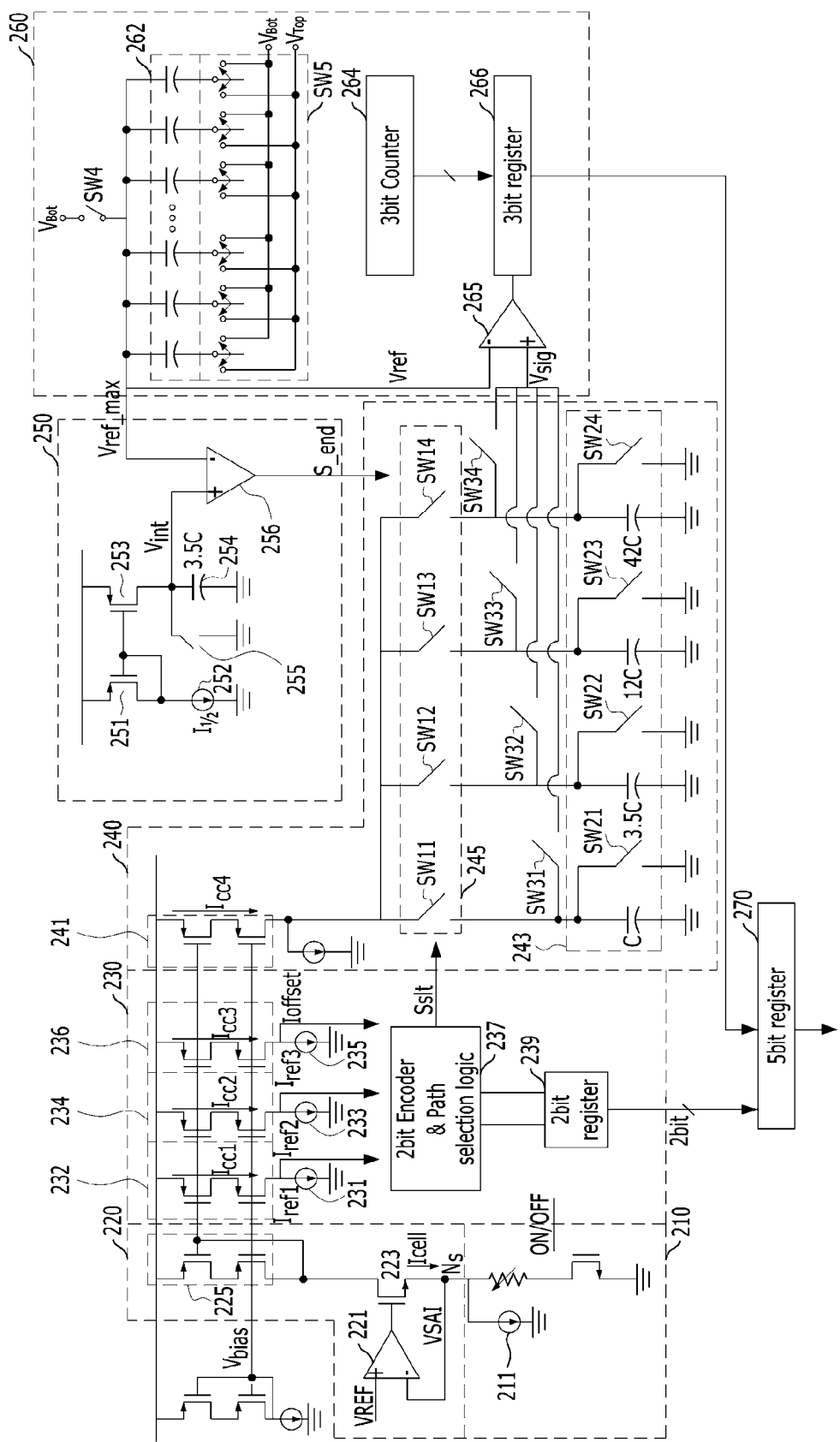
FIG. 2 illustrates a part of a multi-level memory device in accordance with an embodiment.
Figure 3:
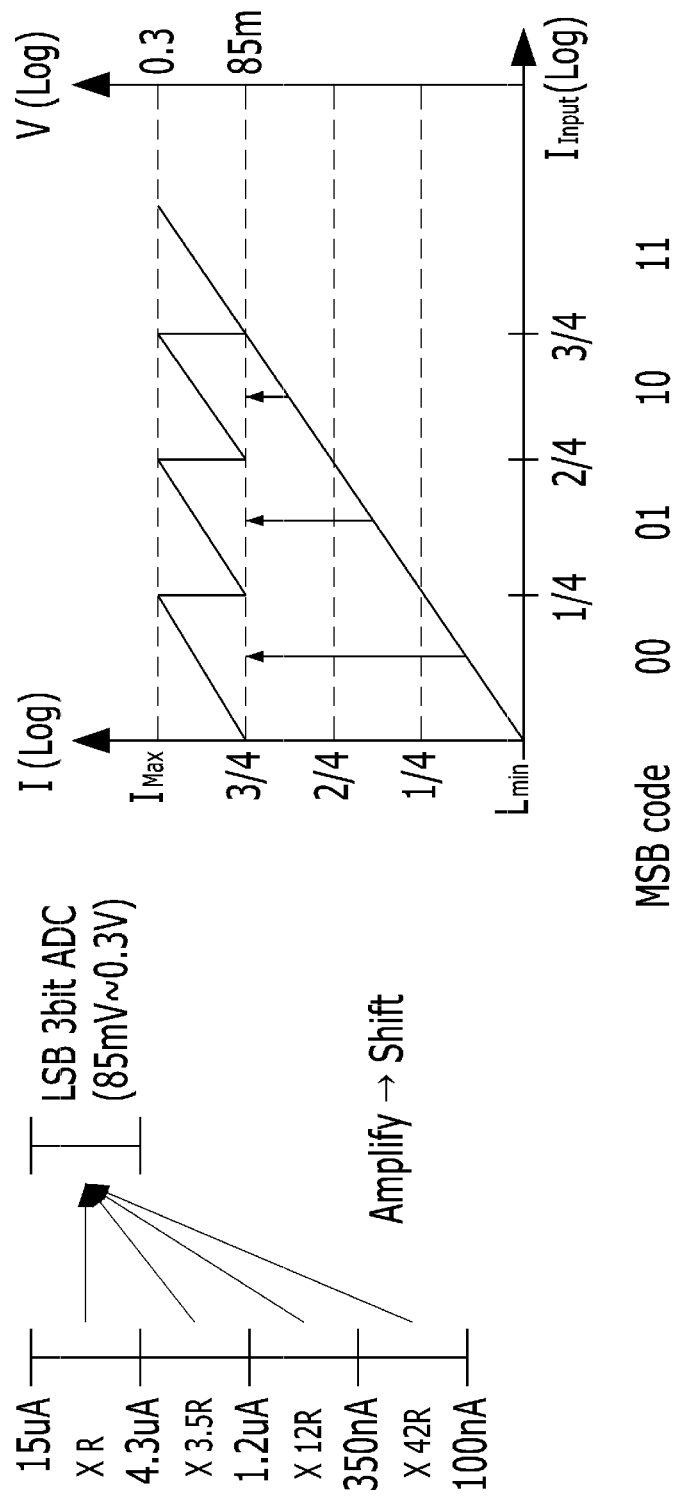
FIG. 3 illustrates an operation of the multi-level memory device shown in FIG. 2 in accordance with an embodiment.

FIG. 2 illustrates a part of a multi-level memory device in accordance with an embodiment. FIG. 3 illustrates an operation of the multi-level memory device shown in FIG. 2 in accordance with an embodiment.

The multi-level memory device may include a memory cell 210, a detection current generation circuit 220, a most significant bit (MSB) determination circuit 230, a current/voltage conversion circuit 240, a charging time determination circuit 250, a least significant bit (LSB) determination circuit 260, and a data output circuit 270.

The memory cell 210 may receive a voltage having a predetermined level, and change a magnitude of a cell current Icell flowing through a sensing node Ns according to a resistance value of the memory cell 210. A first offset current source 211 may draw an offset current (for example, 1 μA) from the sensing node Ns, and thus increase a lower limit of the cell current Icell passing through the cell current driving circuit 225. In accordance with an embodiment, the cell current driving circuit 225 may include one or more switching elements. The gates of the lower transistors in the circuits referred to by numbers 225, 231, 233, 235, and 242 are connected to a bias voltage Vbias shown as FIG. 2.

The detection current generation circuit 220 may amplify a difference between a reference voltage VREF and a sensing node voltage VSAI, and provide a voltage having a predetermined level to the sensing node Ns. The memory cell 210 may be coupled to the sensing node Ns, and the magnitude of the cell current Icell flowing through the sensing node Ns may be changed according to the resistance value of the memory cell 210. That is, the magnitude of the cell current Icell which flows through the sensing node Ns when the memory cell 210 has a small resistance value is larger than that of the cell current Icell which flows through the sensing node Ns when the memory cell 210 has a large resistance value.

The MSB determination circuit 230 may compare the cell current Icell flowing through the memory cell 210 to a plurality of reference currents, and determine the MSBs of data stored in the memory cell 210. In an embodiment, the MSB determination circuit 230 may divide a full range of the cell current Icell into four sections, and determine a section that corresponds to the cell current Icell flowing through the memory cell 210. For example, the MSB determination circuit 230 may determine upper two bits of entire five bits of data stored in the memory cell 210. Specifically, the MSB determination circuit 230 may include first to third copied cell current driving circuits 232, 234, and 236, first to third reference current sources 231, 233, and 235, a two-bit encoder 237, and a two-bit register 239.

Although not illustrated, an offset current source may be coupled in parallel to a corresponding one of the first to third reference current source 231, 233, and 235, and perform in a similar manner to that of the first offset current source 211.

Each of the first to third copied cell current driving circuits 232, 234, and 236 may operate as a current mirror circuit of the cell current driving circuit 225, include one or more switching elements, for example, field-effect transistors (FETs), and generate a copied cell current that is substantially the same as the cell current Icell. For example, the copied cell current may have a magnitude that is substantially the same as that of the cell current. In an embodiment, the switching elements within each of the first to third copied cell current driving circuits 232, 234, and 236 may have substantially the same size as corresponding switching elements of the cell current driving circuit 225.

The first to third reference current sources 231, 233, and 235 may draw currents corresponding to first, second, and third reference currents Iref1 ($=I_{1/4}$+Ioffset), Iref2 ($=I_{1/2}$+Ioffset), and Iref3 ($=I_{3/4}$+Ioffset), respectively, to the ground. In an embodiment, magnitudes of the first, second, and third reference currents Iref1, Iref2, and Iref3 and the maximum cell current are 350 nA+Ioffset, 1.2 μA+Ioffset, 4.3 μA+Ioffset, and 15 μA+Ioffset, respectively, so that these values would be separated by a regular interval when the values are converted into a log scale. Thus, when first to third copied cell currents Icc1 to Icc3 flowing through the first to third copied cell current driving circuits 232, 234, and 236 are larger than the first to third reference currents Iref1 to Iref3, the first to third copied cell current driving circuits 232, 234, and 236 may output currents (or excess currents) exceeding the first to third reference currents Iref1 to Iref3 through the respective output nodes.

The two-bit encoder 237 may encode the excess currents output from the first to third copied cell current driving circuits 232, 234, and 236. For example, the two-bit encoder 237 may receive a three-bit input data associated with the excess currents, and encode the received input data into a two-bit output data. That is, the two-bit encoder 237 may output "00" when the cell current Icell corresponds to the first section in the range equal to or less than the first reference current Iref1, output "01" when the cell current Icell corresponds to the second section in the range from the first reference current Iref1 to the second reference current Iref2, output "10" when the cell current Icell corresponds to the third section in the range from the second reference current Iref2 to the third reference current Iref3, and output "11" when the cell current Icell corresponds to the fourth section in the range greater than the third reference current Iref3. Furthermore, the two-bit encoder 237 may generate a charging path select signal Sslt according to the values of the excess currents.

The two-bit register 239 may store the two MSBs output from the two-bit encoder 237.

The current/voltage conversion circuit 240 may convert the magnitude of the cell current Icell into a predetermined voltage using a capacitor. The current/voltage conversion circuit 240 may change the four cell current sections into one cell voltage section using the cell voltage charging circuit 243 that includes a plurality of capacitors having different charge storing capacities (that is, capacitances) and coupled in parallel to each other. In an embodiment, the plurality of capacitors included in the cell voltage charging circuit 243 have different capacitance values.

Specifically, the current/voltage conversion circuit 240 may include a fourth copied cell current driving circuit 241, the cell voltage charging circuit 243 including the plurality of capacitors having different charge storing capacities, a path selection circuit 245 SW11, SW12, SW13, and SW14, a reset switching circuit SW21, SW22, SW23, and SW24, and a comparison switching circuit SW31, SW32, SW33, and SW34.

The path selection circuit 245 may cause a fourth copied cell current Icc4 to flow from the fourth copied cell current driving circuit 241 to the cell voltage charging circuit 243, according to the charging path select signal Sslt.

For example, when the cell current Icell is equal to or less than the first reference current Iref1, the switch SW11 within the path selection circuit 245 may be selected and turned on according to the charging path select signal Sslt, and the fourth copied cell current Icc4 flowing through the fourth copied cell current driving circuit 241 may charge a first capacitor that has a capacitance value C. When the cell current Icell ranges from the first reference current Iref1 to the second reference current Iref2, the switch SW12 within the path selection circuit 245 may be selected and turned on, and the fourth copied cell current Icc4 flowing through the fourth copied cell current driving circuit 241 may charge a second capacitor that has a capacitance value 3.5 C equal to 3.5 times of the capacitance value C of the first capacitor. When the cell current Icell ranges from the second reference current Iref2 to the third reference current Iref3, the switch SW13 within the path selection circuit 245 may be selected and turned on, and the fourth copied cell current Icc4 flowing through the fourth copied cell current driving circuit 241 may charge a third capacitor that has a capacitance value 12 C equal to 12 times of the capacitance value C of the first capacitor. When the cell current Icell exceeds the third reference current Iref3, the switch SW14 within the path selection circuit 245 may be selected and turned on, and the fourth copied cell current Icc4 flowing through the fourth copied cell current driving circuit 241 may charge a fourth capacitor that has a capacitance value 42 C equal to 42 times of the capacitance value C of the first capacitor. Furthermore, the two-bit encoder 237 may generate the charging path select signal Sslt according to the values of the excess currents.

The reset switching circuit SW21, SW22, SW23, and SW24 may be turned on to reset the first to fourth capacitors of the cell voltage charging circuit 243, respectively.

The comparison switching circuit SW31, SW32, SW33, and SW34 may output a cell voltage corresponding to charges stored in one of the first to fourth capacitors in the cell voltage charging circuit 243.

The charging time determination circuit 250 may output a charging end signal S_end for determining the time during which the fourth copied cell current Icc4 flows, in order to convert the fourth copied cell current Icc4 into a predetermined voltage. That is, the charging time determination circuit 250 may charge a corresponding charging circuit (e.g., a capacitor) with the maximum cell current corresponding to any one of the four sections (see FIG. 3), and output the charging end signal S_end. Specifically, the charging time determination circuit 250 may include a section maximum cell current driving circuit 251, a section maximum current source 252, a section maximum copied cell current driving circuit 253, a section maximum cell voltage charging circuit 254, a reset switch 255, and a charging end signal generation circuit 256. In the interest of brevity, an operation of the charging time determination circuit 250 that corresponds to the second section according to an embodiment will be described below.

A section maximum cell current of the second section, which corresponds to the second reference current Iref2, flows through the section maximum cell current driving circuit 251, using the section maximum current source 252 arranged between the section maximum cell current driving circuit 251 and ground.

The section maximum copied cell current driving circuit 253 may operate as a current mirror circuit of the section maximum cell current driving circuit 251. As a result, a section maximum copied cell current that is substantially the same as the section maximum cell current flows through the section maximum copied cell current driving circuit 253.

The section maximum cell voltage charging circuit 254 may be charged to have a maximum charging voltage Vint at a terminal of the section maximum cell voltage charging circuit 254 while the section maximum copied cell current flows.

The reset switch 255 may be turned on before the section maximum cell voltage charging circuit 254 starts to operate, and reset the section maximum cell voltage charging circuit 254.

The charging end signal generation circuit 256 may compare the maximum reference voltage Vref_max of the LSB determination circuit 260 to the maximum charging voltage Vint of the section maximum cell voltage charging circuit 254, and output the charging end signal S_end when the maximum charging voltage Vint becomes substantially equal to the maximum reference voltage Vref_max. The charging end signal generation circuit 256 may include a comparator. The charging end signal S_end output from the charging end signal generation circuit 256 may turn off the switches SW11, SW12, SW13, and SW14 of the path selection circuit 245. Since the fourth copied cell current Icc4 flowing into the cell voltage charging circuit 243 is blocked, charging of the cell voltage charging circuit 243 may be ended.

After the MSBs of a plurality of bits are determined, the LSB determination circuit 260 may determine the remaining LSBs of the plurality of bits. For example, after two MSBs of five bit data are determined, the LSB determination circuit 260 may determine the remaining three LSBs of the five bits. Specifically, the LSB determination circuit 260 may include a reference voltage generation circuit (SW4, 262, and SW5), a three-bit counter 264, a comparison circuit 265, and a three-bit register 266.

Figure 4:
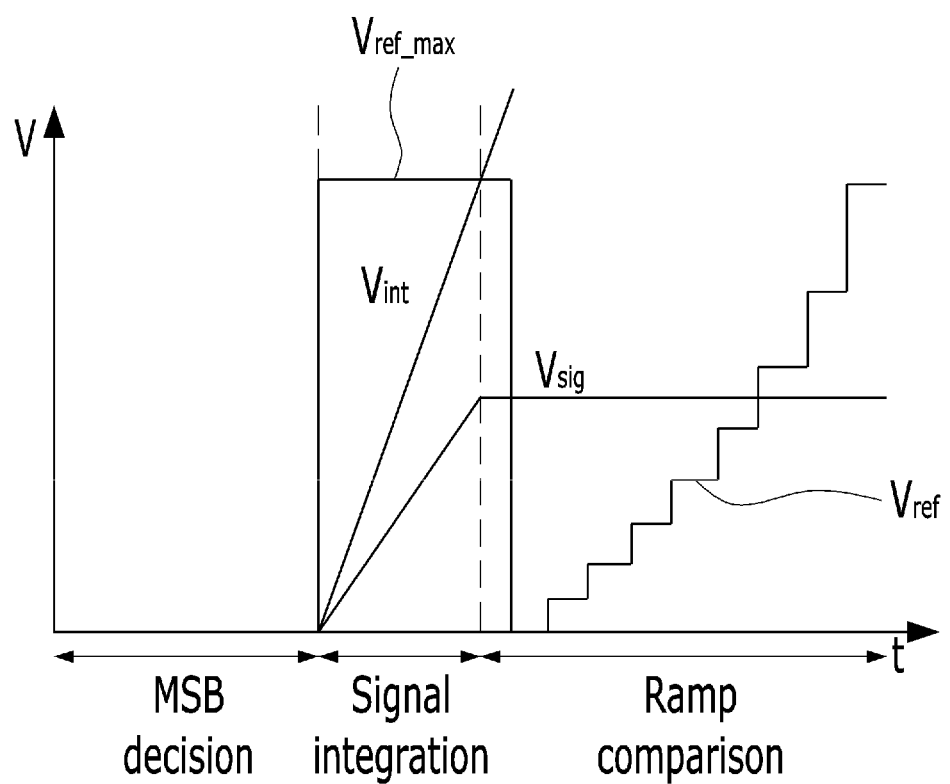
FIG. 4 illustrates generating a charging end signal in accordance an embodiment.
Figure 5:
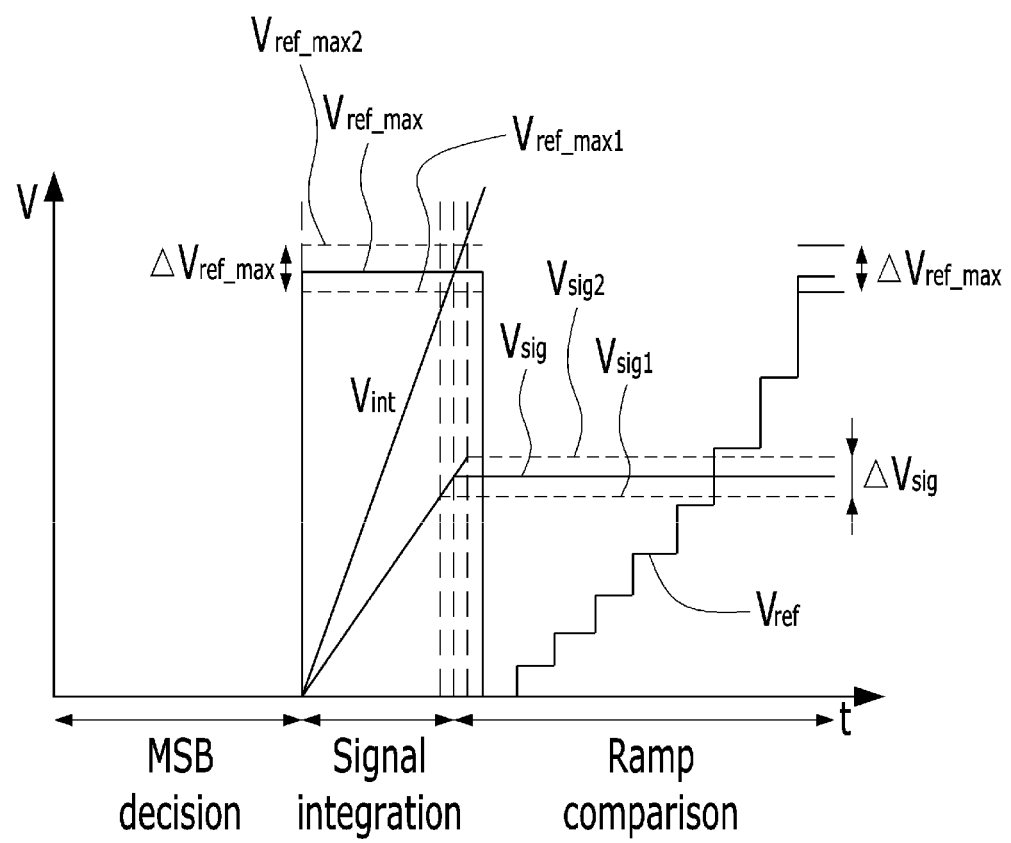
FIG. 5 illustrates generating a corrected charging end signal in accordance with an embodiment.
Figure 6:
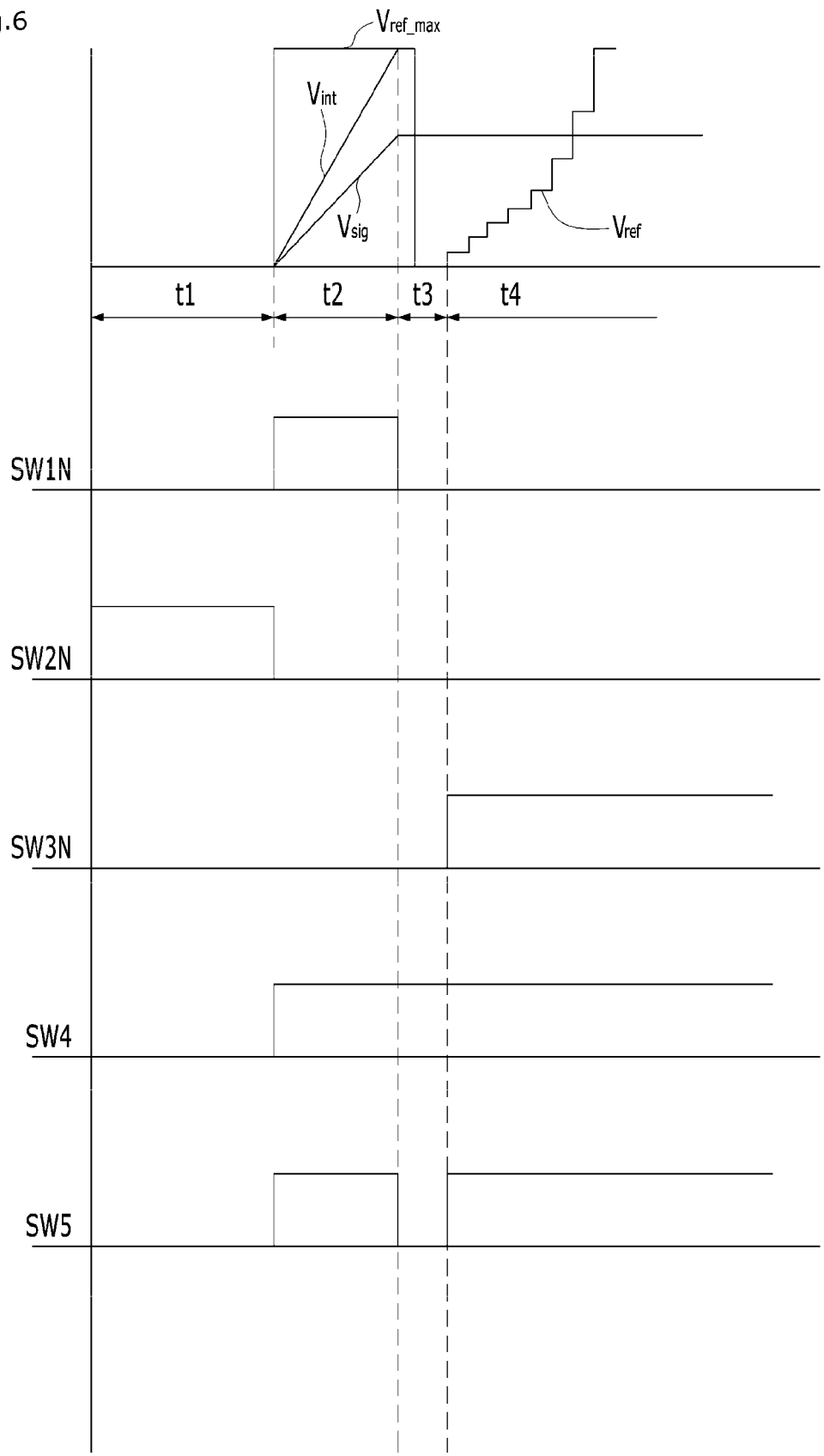
FIG. 6 is a timing diagram of waveforms related to an operation of determining MSBs and LSBs in accordance with an embodiment.

The reference voltage generation circuit includes a ground switch SW4, capacitors 262, and a potential select switch circuit SW5, and the capacitors 262 can be simultaneously or selectively charged and discharged. In an embodiment, the reference voltage generation circuit generates the maximum reference voltage Vref_max during a signal integration operation and a reference voltage Vref during a ramp comparison operation, as shown in FIGS. 4 to 6.

The potential select switch circuit SW5 may include a plurality of switches and the switches may be simultaneously or selectively coupled to simultaneously or selectively charge the plurality of capacitors 262 coupled in parallel. Specifically, when a power supply voltage Vtop is simultaneously coupled to the plurality of capacitors 262 through the plurality of switches of the potential select switch circuit SW5 and the ground switch SW4 is turned off, such as may occur during the signal integration operation shown in FIG. 4, the maximum reference voltage Vref_max may be provided to the charging end signal generation circuit 256. The maximum reference voltage Vref_max may have a single voltage level. Subsequently, such as may occur during the ramp comparison operation shown in FIG. 4, the plurality of switches included in the potential select switch circuit SW5 may sequentially couple the power supply voltage Vtop to the power supply voltage Vtop, such that the number of coupled capacitors 262 increases over time in order to provide the reference voltage Vref to the comparison circuit 265. In an embodiment, at least some of the plurality of capacitors 262 may have different capacitance values from others. As a result, the reference voltage Vref may increase in a stepwise manner as shown in FIG. 4, and the level of the reference voltage Vref exponentially increases as the number of the coupled capacitors 262 increases. Since a person of skill in the art in light of the teachings and disclosures herein would understand the generation of the exponentially increasing a level of the reference voltage Vref using the plurality of capacitors 262, the detailed descriptions are omitted herein in the interest of brevity.

The three-bit counter 264 may output an LSB count signal according to the number of times that the couplings of the switches of the potential select switch circuit SW5 are changed, whenever the switches are sequentially coupled to the power supply voltage Vtop such as when generating the reference voltage Vref. In other words, in an embodiment, the three-bit counter 264 may generate the LSB count signal according to the number of steps of the stepwise increase of the reference signal Vref that have occurred.

The comparison circuit 265 may compare the reference voltage Vref to a cell charging voltage (or a cell voltage) Vsig output from the cell voltage charging circuit 243, and output an H-level signal when a level of the reference voltage Vref (or second reference voltage) becomes equal to or greater than that of the cell voltage Vsig.

The three-bit register 266 may store the LSB count signal output from the three-bit counter 264 and output the stored LSB count signal to the data output circuit 270 in response to the H-level signal output from the comparison circuit 265.

The data output circuit 270 may output five-bit data by combining the two MSBs output from the MSB determination circuit 230 with the three LSBs output from the LSB determination circuit 260.

FIG. 4 illustrates generating a charging end signal in accordance with an embodiment, and FIG. 5 illustrates generating a corrected charging end signal in accordance with an embodiment.

In accordance with the embodiment shown in FIG. 2, when the MSBs of data stored in the memory cell are determined by the MSB determination circuit 230, a selected capacitor of the cell voltage charging circuit 243 may be continuously charged until the charging end signal S_end is output from the charging time determination circuit 250. That is, while the section maximum copied cell current flows into the section maximum cell voltage charging circuit 254 to charge the charging circuit 254 to have the maximum charging voltage Vint at the terminal of the charging circuit 254, the fourth copied cell current Icc4 may flow into the selected capacitor of the cell voltage charging circuit 243 such that the selected capacitor is charged to have a cell charging voltage Vsig at a terminal of the selected capacitor.

Referring to FIG. 5, an error in a capacitance value of the selected capacitor of the cell voltage charging circuit 243 may exist due to a fabrication process of capacitors within the cell voltage charging circuit 243. Such a process variation in the capacitance value of the selected capacitor may lead to a cell charging voltage error ΔVsig. In an embodiment, the capacitor of the section maximum voltage charging circuit 254 and the selected capacitor of the cell voltage charging circuit 243 are implemented as unit capacitors, such that both capacitors have substantially the same size using the same fabrication process. As a result, the capacitance value of the capacitor 254 may have substantially the same process variation as that of the selected capacitor of the cell voltage charging circuit 243. Thus, the time required for the maximum charging voltage Vint to reach the maximum reference voltage Vref_max may be adjusted to compensate for the cell charging voltage error ΔVsig.

A gain error may exist in the reference voltage generation circuit SW4, 262, and SW5. For example, parasitic capacitance associated with a node connected to the capacitors 262 may lead to an error in the reference voltage Vref during the ramp comparison operation as well as a maximum reference voltage error ΔVref_max. Due to the maximum reference voltage error ΔVref_max, the time required the maximum charging voltage Vint to reach the maximum reference voltage Vref_max may differ, resulting in the cell charging voltage error ΔVsig. For example, when the gain error reduces the maximum reference voltage Vref_max to a first maximum reference voltage Vref_max1, the cell charging voltage Vsig at the end of the signal integration operation is decreased to a first cell charging voltage Vsig1. The ratio of an error in the reference voltage Vref to a value of the reference voltage Vref corresponding to the first cell charging voltage Vsig1 is substantially the same as that of the maximum reference voltage error ΔVref_max to the maximum reference voltage Vref_max. As a result, the cell charging voltage error ΔVsig substantially cancels out the error in the reference voltage Vref.

FIG. 6 is a timing diagram of waveforms related to an operation of determining MSBs and LSBs in accordance with an embodiment.

During a first period t1, corresponding to the MSB decision period of FIGS. 4 and 5, the MSB determination circuit 230 determines two MSBs, and the switches of the reset switching circuit SW2N may be turned on to reset corresponding capacitors of the cell voltage charging circuit 243.

During a second period (or a charging time) t2, corresponding to the signal integration period of FIGS. 4 and 5, one switch of the path selection circuit 245 may be selected according to a charging path select signal Sslt and turned on to charge a corresponding one of capacitors within the cell voltage charging circuit 243 such that a terminal of the charged capacitor has a cell charging voltage Vsig. The plurality of switches of the potential select switch circuit SW5 simultaneously couple the plurality of capacitors 262 to the power supply voltage Vtop and the ground switch SW4 is turned off, and thus the maximum reference voltage Vref_max may be provided to the charging end signal generation circuit 256. The section maximum cell voltage charging circuit 254 may be charged to have the maximum charging voltage Vint at the terminal of the charging circuit 254 while the section maximum copied cell current flows into the charging circuit 254. When the maximum charging voltage Vint reaches the maximum reference voltage Vref_max, the charging end signal S_end may be output, and the selected switch within the path selection circuit 245 may be turned off.

During a third period t3, the switches of the potential select switch circuit SW5 may simultaneously couple the plurality of capacitors 262 to the ground voltage Vbot, and thus reset the plurality of capacitors 262.

During a fourth period t4, a switch within the comparison switching circuit SW3N, corresponding to the capacitor charged to have the cell charging voltage Vsig at a terminal, may be turned on and the switches within the potential select switch circuit SW5 may be sequentially turned on to provide the reference voltage Vref. When the number of sequentially coupled switches of the potential select switch circuit SW5 increases, a level of the reference voltage Vref increases in a stepwise manner. When the level of the reference voltage Vref becomes equal to or greater than that of the cell charging voltage Vsig, the comparison circuit 265 may output an H-level signal.

Figure 7:
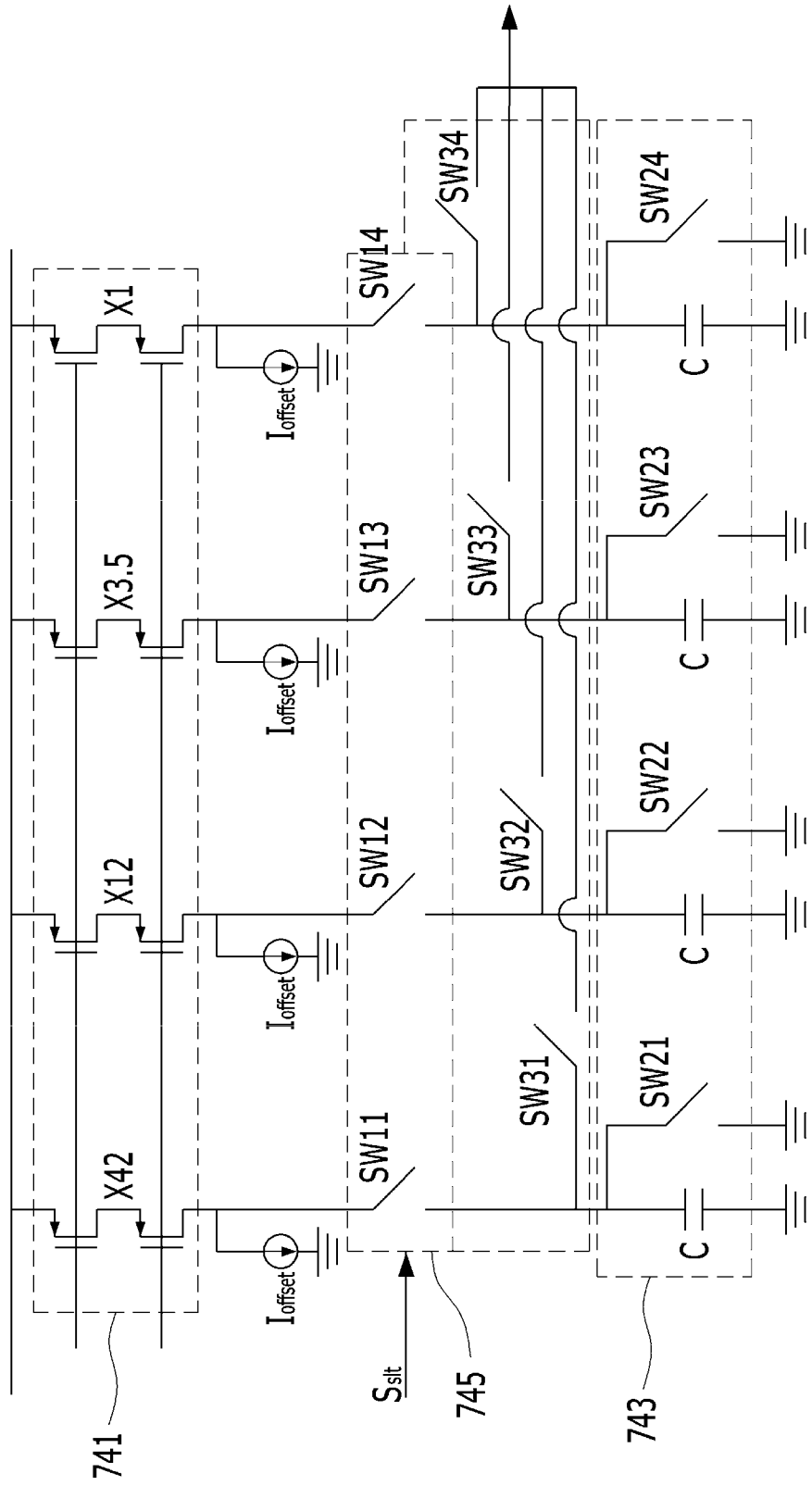
FIG. 7 illustrates a current/voltage conversion circuit suitable for use in the multi-level memory device shown in FIG. 2 in accordance with another embodiment.

FIG. 7 illustrates a current/voltage conversion circuit 740 of the multi-level memory device shown in FIG. 2 in accordance with another embodiment.

The current/voltage conversion circuit 240 of the multi-level memory device of FIG. 2 selectively charges a capacitor among a plurality of capacitors included in the cell voltage charging circuit 243, and the plurality of capacitors have different charge storing capacities. In contrast, the current/voltage conversion circuit 740 of FIG. 7 selectively charges a capacitor among a plurality of capacitors included in a cell voltage charging circuit 743 using a plurality of copied cell current driving circuits 741 having different sizes (e.g., different length to width ratios), while the plurality of capacitors have substantially the same charge storing capacity (e.g., the same capacitance value). For example, when the cell current Icell of FIG. 2 is equal to or less than the first reference current Iref1, a first switch SW11 within the path selection circuit 745 may be selected according to a charging path select signal Sslt. When the cell current Icell ranges from the first reference current Iref1 to the second reference current Iref2, a second switch SW12 within the path selection circuit 745 may be selected. When the cell current Icell ranges from the second reference current Iref2 to the third reference current Iref3, a third switch SW13 within the path selection circuit 745 may be selected. When the cell current Icell exceeds Iref3, a fourth switch SW14 within the path selection circuit 245 may be selected.

Since the other configurations and operations of the multi-level memory device of FIG. 7 are similar to those of the multi-level memory device of FIG. 2, the detailed descriptions thereof are omitted herein in the interest of brevity.

Figure 8:
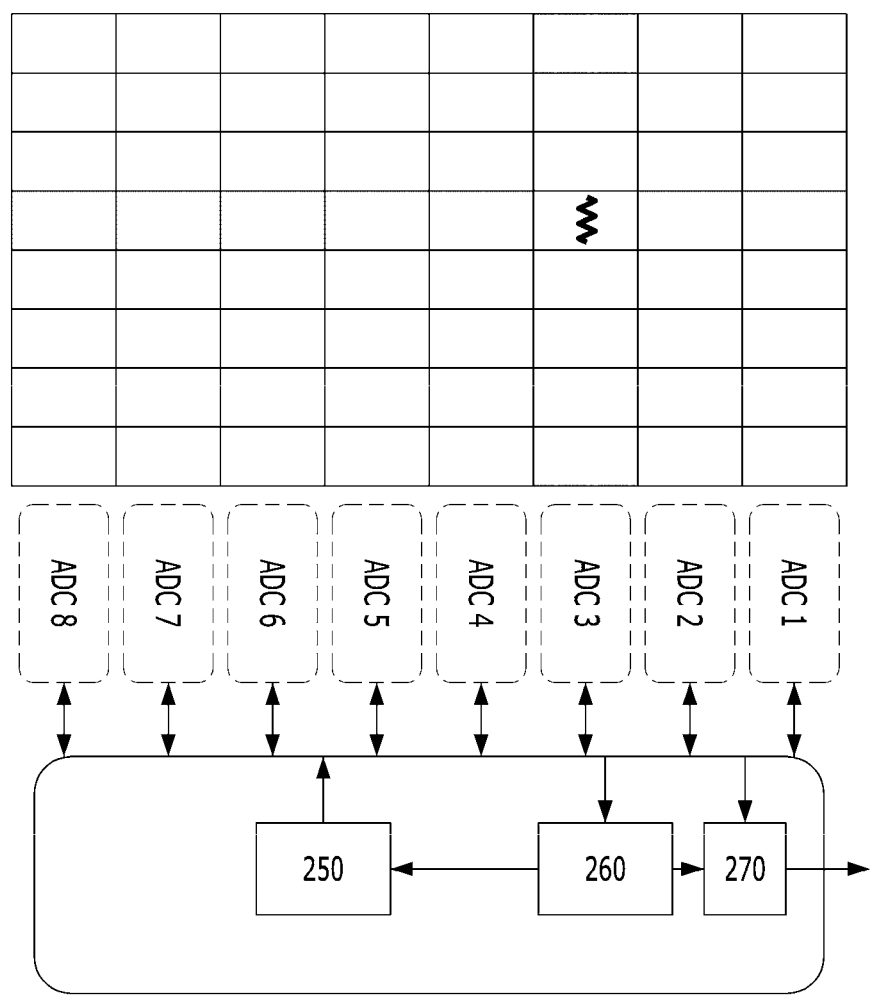
FIG. 8 illustrates a multi-level memory device in which an LSB determination circuit and a charging time determination circuit are shared in accordance with an embodiment.

FIG. 8 is a block diagram of a multi-level memory device in accordance with an embodiment. The multi-level memory device may have a configuration in which the LSB conversion circuit 260 and the charging time determination circuit 250 are shared.

Specifically, the multi-level memory device shown in FIG. 8 may include a plurality of A/D converters ADC1-ADC8 in order to rapidly read data within memory cells. Each of the A/D converters ADC1-ADC8 may include a detection current generation circuit (such as the detection current generation circuit 220 of FIG. 2), a MSB conversion circuit (such as the MSB conversion circuit 230 of FIG. 2), and a current/voltage conversion circuit (such as the current/voltage conversion circuit 240 of FIG. 2 or the current/voltage conversion circuit 740 of FIG. 7). The plurality of A/D converters ADC1-ADC8 may share the LSB conversion circuit 260 and the charging time determination circuit 250.

In a multi-level memory device according to an embodiment, since a cell current does not continuously flow into a memory cell while data stored in the memory cell is detected, power consumption for detecting the data stored in the memory cell can be reduced. In an embodiment, since the multi-level memory device perform the MSB reading operation for data stored in one memory cell while the LSBs of the data stored in the other memory cell are read, a data processing time can be reduced by performing the MSB reading operation of the one memory cell while simultaneously performing the LSB reading of the other memory cell.

Although various embodiments have been described for illustrative purposes, it will be apparent to those skilled in the art that various changes and modifications may be made without departing from the spirit and scope of the invention as defined in the following claims.

What is claimed is:

1. A multi-level memory device comprising:
   a most significant bit (MSB) determination circuit configured to determine a plurality of MSBs by comparing a cell current flowing through a memory cell with a predetermined reference current;
   a current/voltage conversion circuit configured to convert a copied cell current obtained by copying the cell current into a cell voltage;
   a charging time determination circuit configured to determine a charging time during which the copied cell current is converted into the cell voltage and output a charging end signal; and
   a least significant bit (LSB) determination circuit configured to determine a plurality of LSBs according to the cell voltage and the charging end signal.

2. The multi-level memory device of claim 1, wherein the current/voltage conversion circuit comprises:
   a cell voltage charging circuit comprising a plurality of capacitors coupled in parallel, the plurality of capacitors including a capacitor that has a terminal, the capacitor being charged to have the cell voltage at the terminal;
   a path selection circuit configured to provide a path through which the copied cell current flows into the charged capacitor, in response to an output of the MSB determination circuit; and
   a comparison switching circuit configured to couple the charged capacitor to the LSB determination circuit and output the cell voltage according to the charging end signal.

3. The multi-level memory device of claim 2, wherein the plurality of capacitors have different capacitances.

4. The multi-level memory device of claim 2, wherein the plurality of capacitors have substantially the same capacitance.

5. The multi-level memory device of claim 1, wherein the charging time determination circuit comprises:
   a section maximum cell current driving circuit configured to generate a section maximum cell current;
   a section maximum copied cell current driving circuit configured to generate a section maximum copied cell current that is substantially the same as the section maximum cell current;

a section maximum cell voltage charging circuit including
a terminal, the section maximum cell voltage charging
circuit configured to receive the section maximum copied cell current and be charged to have a maximum
charging voltage at the terminal; and
a charging end signal generation circuit configured to output the charging end signal, when a level of the maximum charging voltage becomes substantially equal to
that of a first reference voltage output from the LSB
determination circuit.

6. The multi-level memory device of claim 1, wherein the LSB bit determination circuit comprises:
a reference voltage generation circuit configured to generate first and second reference voltages;
a bit counter configured to output an LSB count signal according to the second reference voltage;
a comparison circuit configured to compare the second reference voltage and the cell voltage and output a result of the comparison; and
an LSB bit storage configured to store the LSB count signal and output the stored LSB count signal in response to the result of the comparison.

7. A multi-level memory device comprising:
a plurality of analog/digital (A/D) converters;
a charging time determination circuit configured to determine a time during which a copied cell current is converted into a cell voltage and output a charging end signal, the copied cell current being substantially the same as a cell current flowing through a memory cell; and
a least significant bit (LSB) determination circuit configured to determine a plurality of LSBs of data stored in the memory cell according to the charging end signal,
wherein the A/D converters share the charging time determination circuit and the LSB determination circuit.

8. The multi-level memory device of claim 7, wherein each of the A/D converters comprises:
a most significant bit (MSB) determination circuit configured to determine a plurality of MSBs by comparing the cell current to a predetermined reference current; and
a current/voltage conversion circuit configured to convert the copied cell current into the cell voltage.

9. The multi-level memory device of claim 8, wherein the current/voltage conversion circuit comprises:
a cell voltage charging circuit comprising a plurality of capacitors coupled in parallel, the plurality of capacitors including a capacitor that has a terminal, the capacitor being charged to have the cell voltage at the terminal;
a path selection circuit configured to provide a path through which the copied cell current flows into the charged capacitor, in response to an output of the MSB determination circuit; and
a comparison switching circuit configured to couple the charged capacitor to the LSB determination circuit and output the cell voltage according to the charging end signal.

10. The multi-level memory device of claim 9, wherein the plurality of capacitors have different capacitances.

11. The multi-level memory device of claim 9, wherein the plurality of capacitors have substantially the same capacitance.

12. The multi-level memory device of claim 8, wherein the charging time determination circuit comprises:

a section maximum cell current driving circuit configured to generate a section maximum cell current;
a section maximum copied cell current driving circuit configured to generate a section maximum copied cell current that is substantially the same as the section maximum cell current;
a section maximum cell voltage charging circuit including a terminal, the section maximum cell voltage charging circuit configured to receive the section maximum copied cell current and be charged to have a maximum charging voltage at the terminal; and
a charging end signal generation circuit configured to output the charging end signal when the maximum charging voltage becomes substantially equal to that of a first reference voltage output from the LSB determination circuit.

13. The multi-level memory device of claim 8, wherein the LSB bit determination circuit comprises:
a reference voltage generation circuit configured to generate first and second reference voltages;
a bit counter configured to output an LSB count signal according to the second reference voltage;
a comparison circuit configured to compare the second reference voltage and the cell voltage and output a result of the comparison; and
an LSB bit storage configured to store the LSB count signal and output the stored LSB count signal in response to the result of the comparison.

14. A data sensing method of a multi-level memory device, comprising:
determining a plurality of most significant bits (MSBs) by comparing a cell current flowing through a memory cell to a predetermined reference current;
converting a copied cell current obtained by coping the cell current into a cell voltage, and storing the cell voltage during a charging time;
determining the charging time during which the copied cell current is converted into the cell voltage and outputting a charging end signal; and
determining a plurality of least significant bits (LSBs) according to the cell voltage and the charging end signal.

15. The data sensing method of claim 14, wherein determining of the plurality of LSBs comprises:
sequentially coupling a plurality of capacitors to a power supply voltage;
generating a reference voltage that increases in a stepwise manner as a number of the sequentially coupled capacitors increases; and
outputting an LSB count signal when a level of the reference voltage becomes equal to or greater than that of the cell voltage.

16. The data sensing method of claim 15, wherein the level of the reference voltage increases exponentially when the plurality of capacitors are sequentially coupled to the power supply voltage.

17. The data sensing method of claim 14, wherein determining the plurality of MSBs is performed during a first period of time, the charging time is a second period of time, and determining the plurality of LSBs is performed during a third period of time, and wherein the cell current flows through the memory cell during the first and second periods and does not flow during the third period.

* * * * *